US007812591B1

(12) United States Patent  (10) Patent No.: US 7,812,591 B1
Pan et al.  (45) Date of Patent: Oct. 12, 2010

(54) HIGH-SPEED SIGNAL DETECT FOR SERIAL INTERFACE

(75) Inventors: Mingde Pan, Morgan Hill, CA (US); Juei-Chu Tu, Milpitas, CA (US); Weiqi Ding, Fremont, CA (US)

(73) Assignee: Altera Corporation, San Jose, CA (US)

( * ) Notice: Subject to any disclaimer, the term of this patent is extended or adjusted under 35 U.S.C. 154(b) by 320 days.

(21) Appl. No.: 12/029,659

(22) Filed: Feb. 12, 2008

(51) Int. Cl.
    *G01R 19/00* (2006.01)
(52) U.S. Cl. .................. 324/76.11; 327/72; 341/164; 375/355
(58) Field of Classification Search ............ 324/76.11
    See application file for complete search history.

(56) References Cited

U.S. PATENT DOCUMENTS

| | | | |
|---|---|---|---|
| 5,856,750 A * | 1/1999 | Koseki ............ | 327/72 |
| 6,820,179 B2 * | 11/2004 | Kobayashi et al. ...... | 711/156 |
| 7,088,794 B2 * | 8/2006 | Nichols .............. | 375/345 |
| 7,474,234 B2 * | 1/2009 | Wagensohner et al. ..... | 341/53 |
| 7,589,651 B1 * | 9/2009 | Shumarayev et al. ..... | 341/132 |
| 2004/0264614 A1 * | 12/2004 | Tinker ............... | 375/355 |
| 2007/0252622 A1 * | 11/2007 | Saenz et al. ......... | 327/72 |
| 2009/0121790 A1 * | 5/2009 | Brown et al. ......... | 330/279 |
| 2010/0042877 A1 * | 2/2010 | Tan ................ | 714/704 |

* cited by examiner

*Primary Examiner*—Timothy J Dole
*Assistant Examiner*—Benjamin M Baldridge
(74) *Attorney, Agent, or Firm*—Ropes & Gray LLP; Jeffrey H. Ingerman

(57) ABSTRACT

More accurate signal detection circuitry in serial interfaces, particularly on a programmable integrated circuit device, such as a PLD, includes a high-speed, high-resolution, high-bandwidth comparator, along with digital filtering, to reduce the effect of process, temperature or supply variations. The comparator is used to compare a direct input signal with a programmable reference voltage, and, in a preferred embodiment, can detect the signal level within 8 mV accuracy. The output of the comparator may then be digitally filtered. Preferably, both a high-pass digital filter and a low-pass analog filter may be used to eliminate glitches and low-frequency noise. Preferably, the digital filters are programmable to adjust the sensitivity to noise. The filtered output is then latched and output to indicate receipt or loss of signal. This signal detect circuitry can operate reliably at data rates as high as 7 Gbps.

16 Claims, 7 Drawing Sheets

HIGH-SPEED SIGNAL DETECT FOR SERIAL INTERFACE

BACKGROUND OF THE INVENTION

This invention relates to signal detect circuitry for a high-speed serial interface, especially in a programmable device.

Programmable integrated circuit devices, such as programmable logic devices (PLDs), frequently incorporate high-speed serial interfaces to accommodate high-speed (greater than 1 Gbps) serial I/O standards, which operate at data rates of up to 6 Gbps or higher. Each high-speed serial interface may include one or more transceivers.

Each transceiver typically includes signal detection circuitry in both its receiver and transmitter portions. In the receiver portion, the signal detection circuitry typically is referred to as "signal detect" or "SD," and generates a signal that alerts the rest of the receiver to incoming data. In the transmitter portion, the signal detection circuitry typically is referred to as "receiver detect" or "RxD," and generates a signal when it detects that transmitted signals are being received by a receiver at the other end.

Known signal detection circuits are analog, and typically incorporate a rectifier and an integrator, which produce a signal that is detected by a sense amplifier and then compared to a reference level by a high-speed peak detector utilizing a voltage-follower configuration. The voltage follower is designed such that the charge current is much higher than the discharge current. This can lead to static offsets. As an analog circuit, the signal detector may be subject to variations in process, temperature and/or supply. In addition, the sense amplifier may need to have a large bandwidth, making it difficult to design for higher data rates.

SUMMARY OF THE INVENTION

The present invention provides more accurate signal detection circuitry in serial interfaces, particularly on a programmable integrated circuit device, such as a PLD. In accordance with the invention, a high-speed, high-resolution, high-bandwidth comparator, along with digital filtering, are used to reduce the effect of process, temperature or supply variations. The comparator is used to compare a direct input signal with a programmable reference voltage, and, in a preferred embodiment, can detect the signal level within 8 mV accuracy.

The output of the comparator may then be digitally filtered. Preferably, both a high-pass digital filter and a low-pass digital filter may be used to eliminate glitches and low-frequency noise. Preferably, the digital filters are programmable to adjust the sensitivity to noise. The filtered output is then latched and output to indicate receipt or loss of signal.

This signal detect circuitry can operate reliably at data rates as high as 7 Gbps.

Thus, in accordance with the present invention, there is provided signal detect circuitry for an input of a serial interface. The signal detect circuitry includes a reference generator that outputs a reference voltage, a comparator that compares the input to that reference voltage to provide a comparator output, and signal detection logic that operates on the comparator output to provide a detection signal indicative of a received signal on the input. The reference voltage and sensitivity of the comparator are programmable, and the sensitivity is matched to the reference voltage to increase at least one of speed, resolution and bandwidth of said signal detect circuitry.

An integrated circuit device, such as a programmable logic device, incorporating such an interface is also provided.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which.

DETAILED DESCRIPTION OF THE INVENTION

The invention will now be described with reference to FIGS. 1-7.

Figure 1:
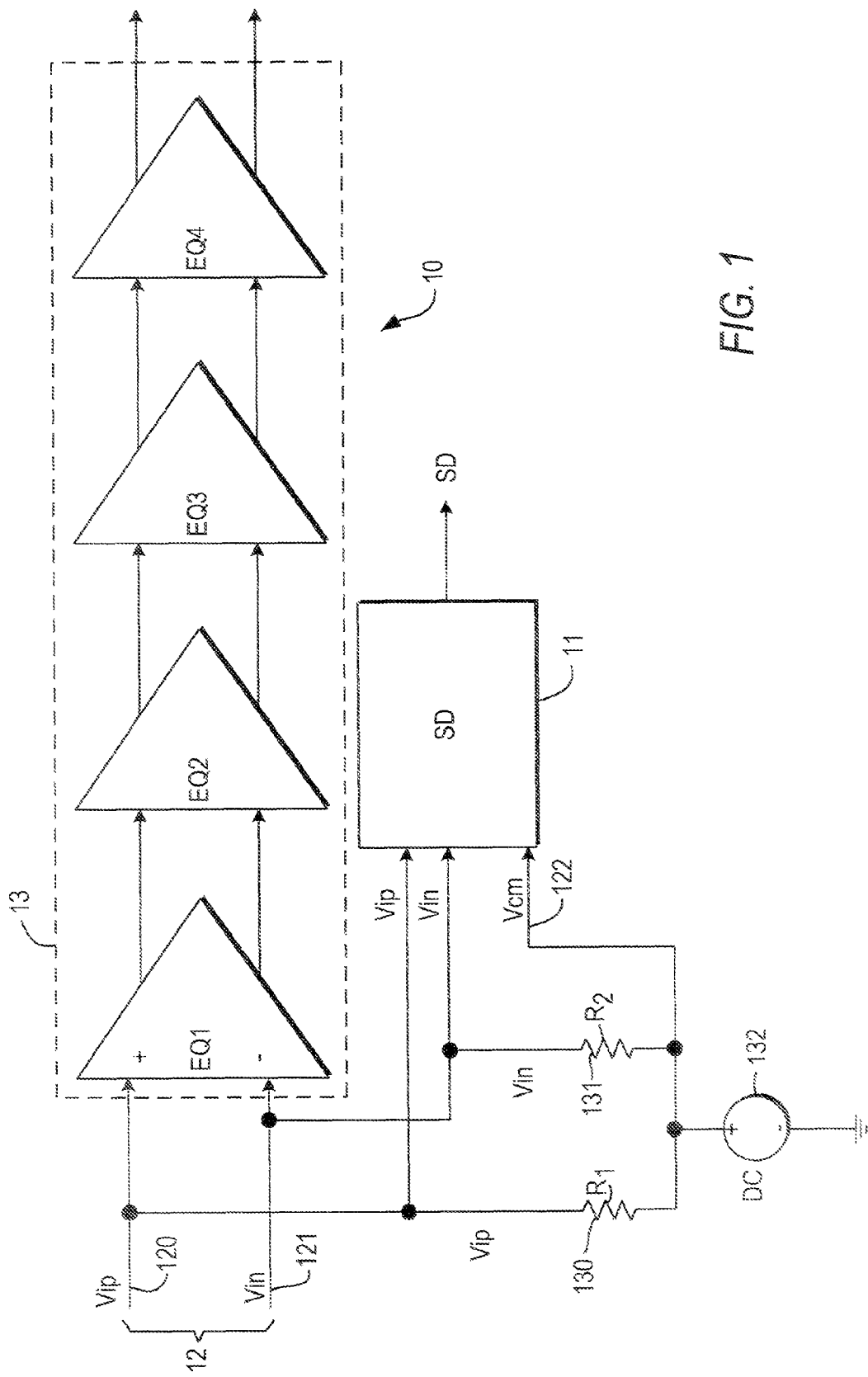
FIG. 1 is a schematic representation of a portion of receiver circuitry incorporating signal detect circuitry according to an embodiment of the present invention.

FIG. 1 shows an example of a portion 10 of receiver circuitry (which may be part of a larger transceiver) incorporating signal detect circuitry 11 according to an embodiment of the present invention. Receiver circuitry 10 as shown is a differential receiver, receiving in input signal 12 having a positive input voltage component $V_{ip}$ 120 and a negative input voltage component $V_{in}$ 121. However, receiver circuitry incorporating the invention also may be single-ended.

Figure 2:
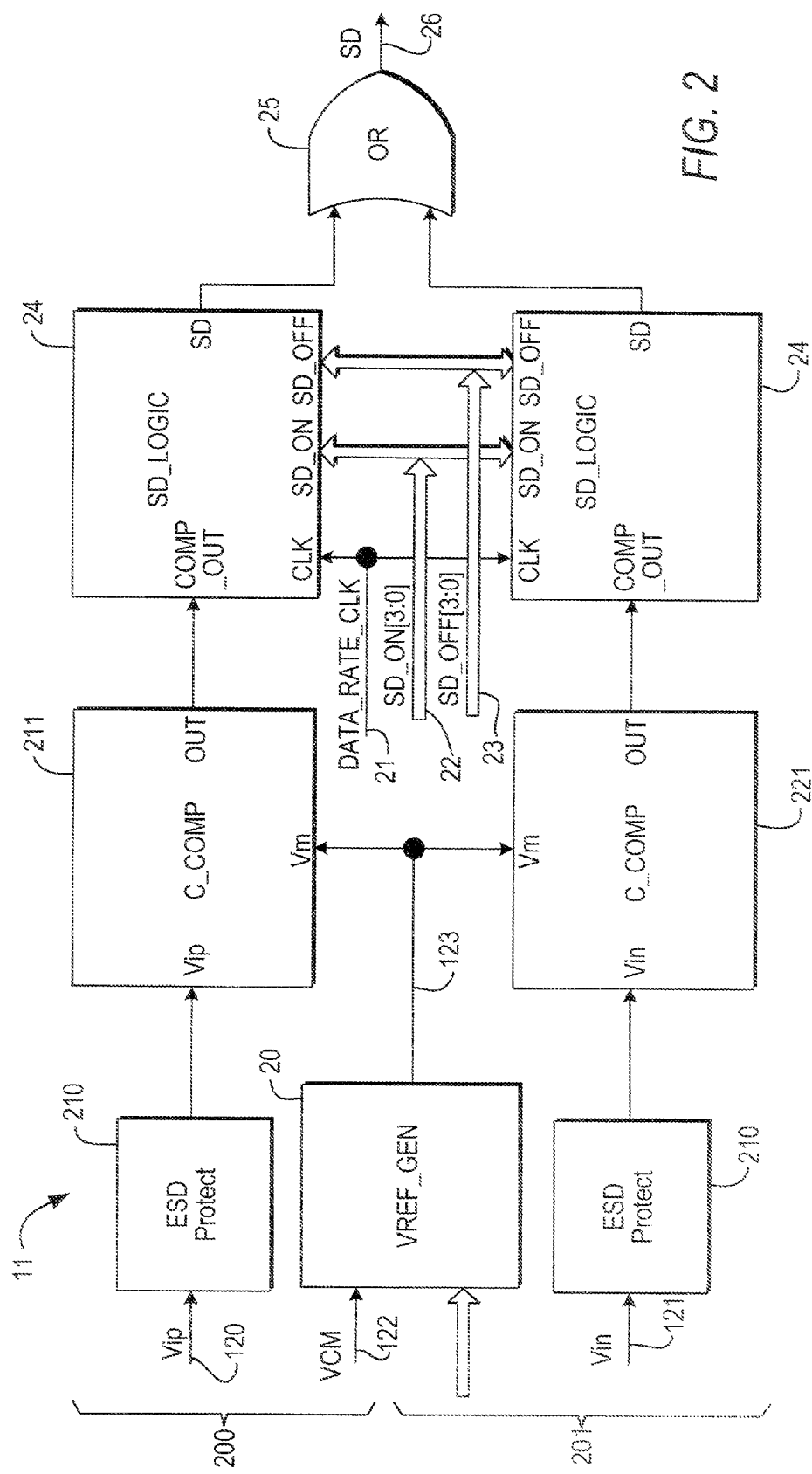
FIG. 2 is a schematic representation of signal detect circuitry according to an embodiment of the present invention.

Input signal 12 may be processed through equalization circuitry 13 before being processed by the remainder of the receiver circuitry. However, that processing cannot occur until signal detect circuitry 11 signals to that remainder of the receiver circuitry that signal 12 is being received. In the differential example shown, signal detect circuitry 11 receives input voltage components 120, 121, as well as a common-mode voltage ($V_{cm}$) 122 provided by voltage source 132, which provides a DC common voltage for all circuits in the transceiver. Resistances ($R_1$) 130 and ($R_2$) 131 are provided for impedance matching and may have equal resistance values—e.g., 50Ω. No DC current will flow through resistances 130, 131, so that the DC component of $V_{ip}$ 120 and $V_{in}$ 121 is $V_{cm}$ 122. As seen in FIG. 2, which shows the interior detail of an embodiment of signal detect circuitry 11, signal detect circuitry 11 also receives data-rate clock signal 21, SD_ON signal 22 and SD_OFF signal 23, which are used by each of signal-detect logic (SD_LOGIC) units 24.

Figure 3:
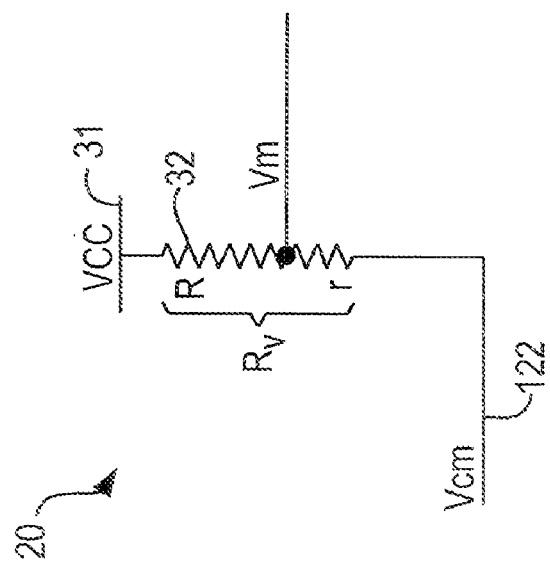
FIG. 3 is a schematic representation of reference voltage circuitry that may be used in signal detect circuitry according to an embodiment of the present invention.

A reference voltage ($V_m$) 123 is derived from $V_{cm}$ 122 by reference voltage generator 20. As seen in FIG. 3, reference voltage generator 20 may be a voltage divider that divides the difference between supply voltage ($V_{cc}$) 31 and $V_{cm}$ 122 using a variable resistor ($R_v$) 32, divisible into two legs r and R. Thus:

$$V_m = (V_{cc} - V_{cm})(r/(r+R)) + V_{cm}$$

The relative sizes of r and R may be user-programmable, allowing programmability of the reference voltage $V_m$, which in turn controls the value of a threshold voltage $V_{th} = V_m - V_{cm} = (V_{cc} - V_{cm})(r/(r+R))$.

Figure 4:
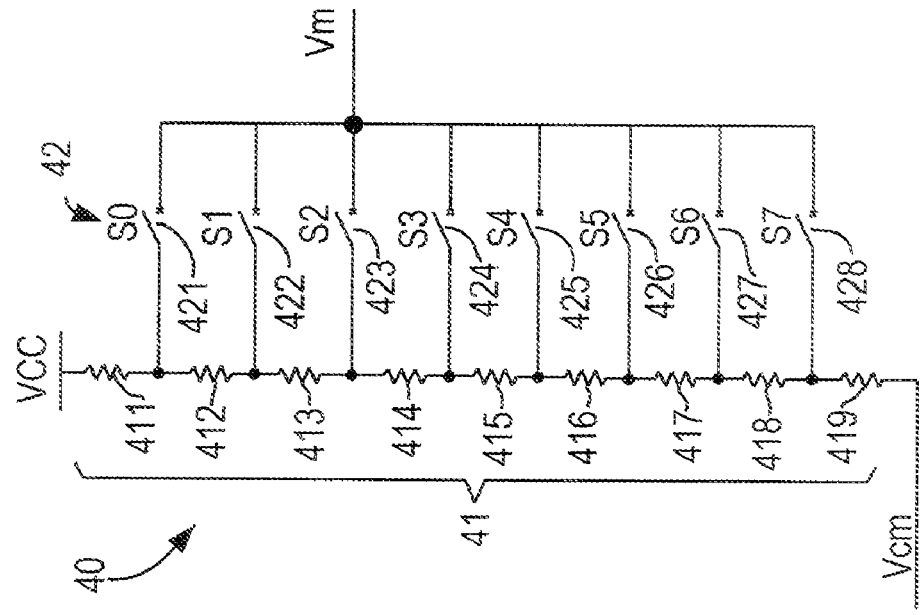
FIG. 4 is a schematic representation of a specific embodiment of reference voltage circuitry that may be used in signal detect circuitry according to an embodiment of the present invention.

In the embodiment 40 shown in FIG. 4, $R_v$ 32 is implemented by resistor train 41, with a plurality of switches 42 allowing resistor train 41 to be tapped between any two resistors. In this embodiment, there are nine resistors 411-419 and eight switches 421-428 ($S_0$-$S_7$). Accordingly, a 3-bit control variable allows eight possible settings for $V_{th}$. In an exemplary implementation of this embodiment, resistor 411 has a resistance of 50 kΩ, resistor 419 has a resistance of 3 kΩ, and each of resistors 412-418 has a resistance of 1 kΩ. If $V_{cc} - V_{cm} = 300$ mV, then the voltage drop across each kilohm of resistance is 5 mV. Thus, in this example, $V_{th}$ can have one of eight values between 15 mV and 50 mV in steps of 5 mV.

As seen in FIG. 2, each of the two differential signal components 120, 121 is processed separately in legs 200, 201 of signal detect circuitry 11, and the results are ORed together by OR-gate 25. Thus, if either leg detects a signal, output signal (SD) 26 will be high. In the case of a single-ended system, only leg 200 would be present. Each leg 200, 201 includes electrostatic discharge protection 210, 220, which may be conventional, a comparator 211, 221 (shown in more detail in FIG. 5) that compares the input signal component 120 or 121 to $V_m$, and signal-detect logic (SD_LOGIC) 24 (shown in more detail in FIG. 7).

Figure 5:
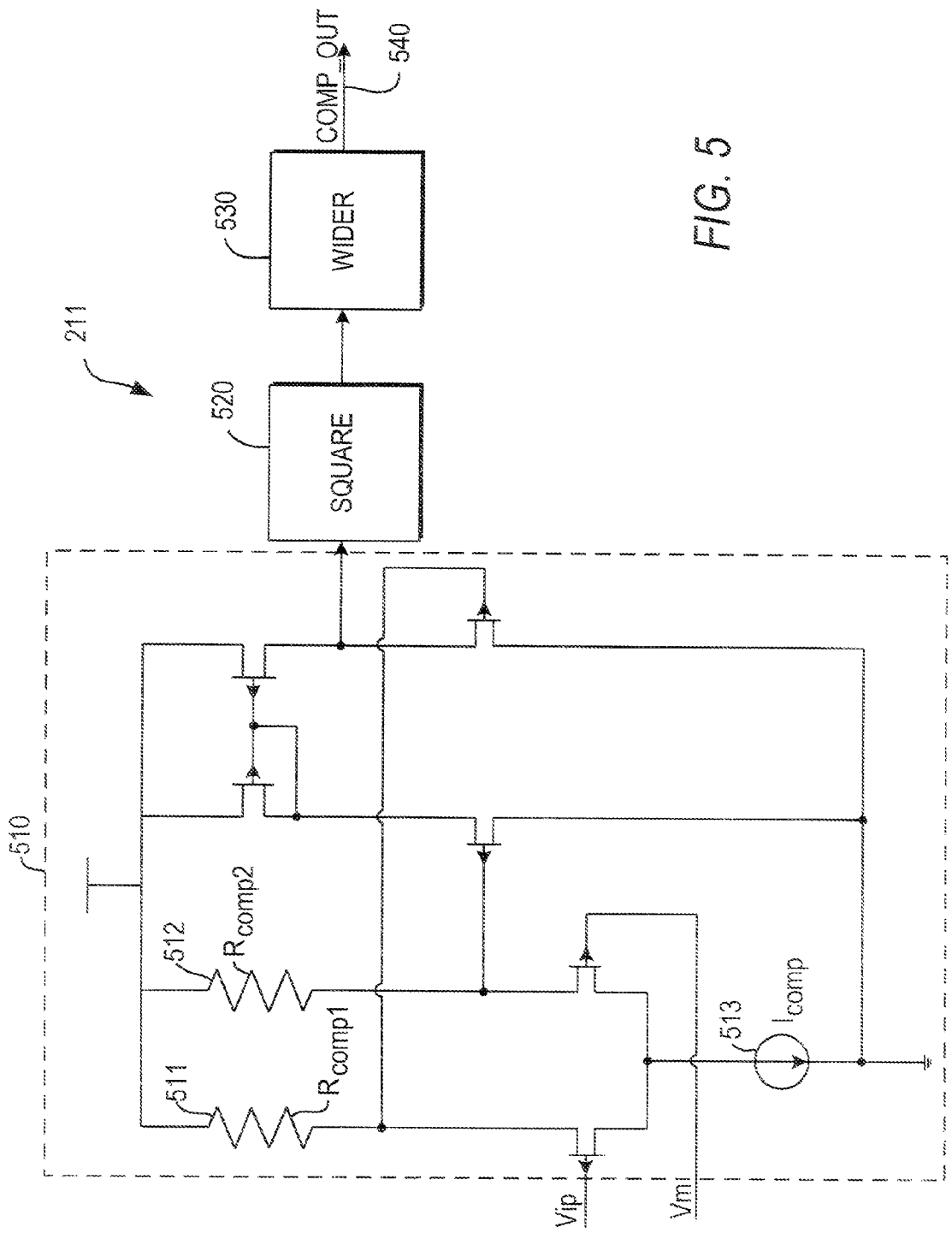
FIG. 5 is a schematic representation of comparator circuitry that may be used in signal detect circuitry according to an embodiment of the present invention.
Figure 6:
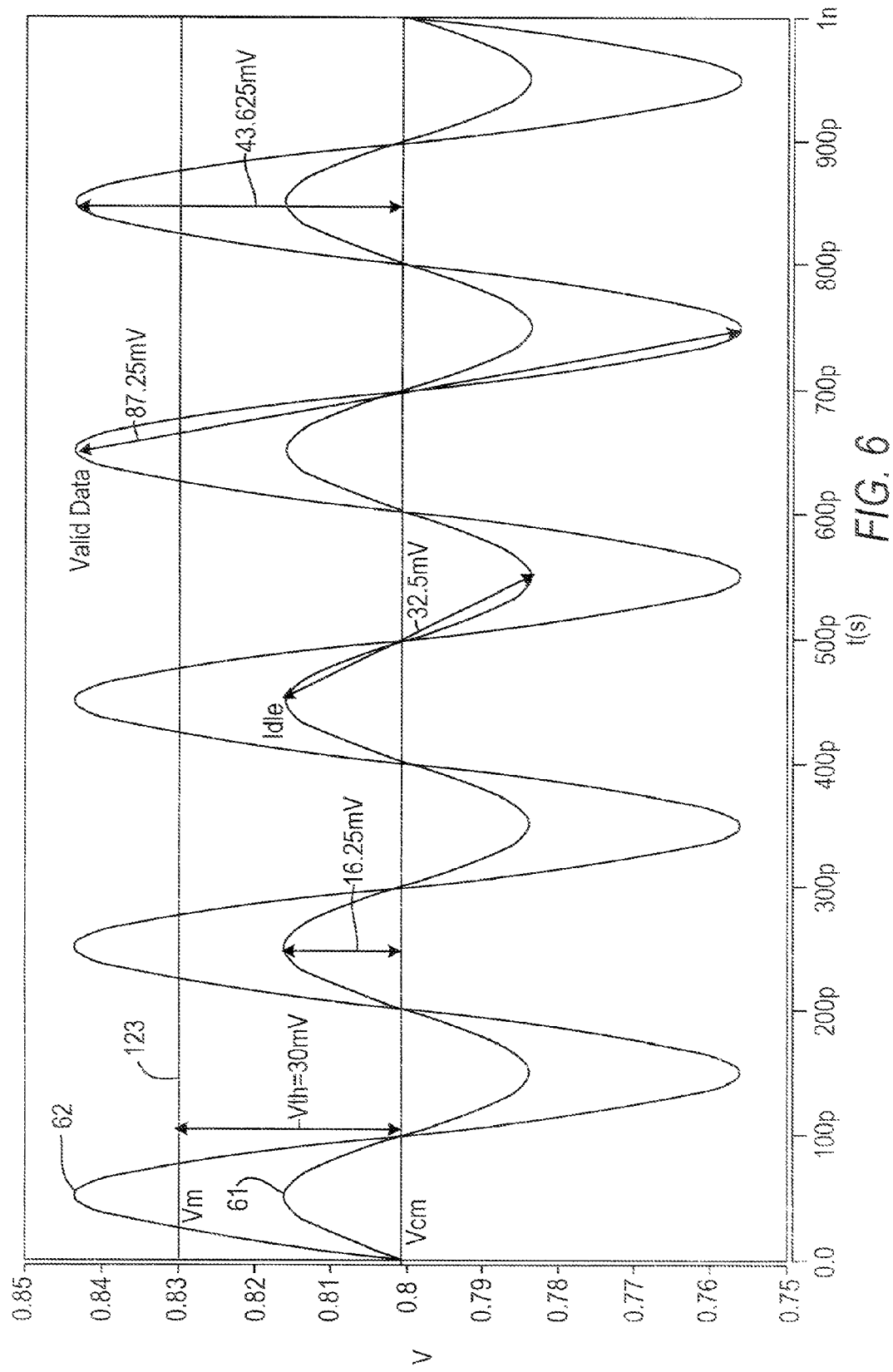
FIG. 6 is a graphical comparison of valid and idle data.

The details of an embodiment of comparator 211, which compares $V_{ip}$ 120 to $V_m$ 123 are shown in FIG. 5. Comparator 221, which compares $V_{in}$ 121 to $V_m$ 123, is the mirror image. Comparator 211 as shown includes comparator stage 510 and SQUARE and WIDER modules 520, 530, which together function as an analog-to-digital converter. As shown in FIG. 6, when the receiver is idle, $V_{ip}$ 61 is always less than $V_m$ 123. Accordingly, the outputs of stage 510 and modules 520, 530 will be low. On the other hand, when valid data is being received, as seen in FIG. 6, $V_{ip}$ 62 is sometimes greater than $V_m$ 123. At those times, the output of stage 510 will switch from low to high and then back to low when $V_{ip}$ 62 becomes less than $V_m$ 123. Therefore, the output of stage 510 will be toggling and many not exhibit a full rail-to-rail swing. SQUARE module 520 converts the analog toggling to a digital rail-to-rail pulse.

As also seen in FIG. 6, the output of SQUARE module 520 is high only when $V_{ip}$ 62 is greater than $V_m$ 123, and may have a duty cycle less than 50-%, or even less than 10% if the input data is weak. Such narrow pulses may not be wide enough to reset or drive the counters in SD_LOGIC 24 (see below). Therefore, WIDER module 530 may be provided to widen any pulse output by SQUARE module 520, preferably to a duty cycle of at least 35%.

It is apparent from the foregoing discussion that it is important to be able to accurately measure when $V_{ip}$ 62 crosses $V_m$ 123. Preferably, comparator stage 510 would be optimized at $V_m$ 123 in terms of gain and bandwidth to be able to react to a small and/or short crossing of $V_m$ 123 by $V_{ip}$ 62. Comparator stage 510 may be essentially conventional, but in accordance with a preferred embodiment, the values $R_{comp1}$, $R_{comp2}$ of resistors 511, 512, as well as current ($I_{comp}$) 513, are programmable, and may be chosen so that the voltage drop across $R_{comp1}$ 511 and $R_{comp2}$ 512 is as close as possible to $V_{cc} - V_m$, taking into account the programmable value of $V_m$ 123 from reference voltage generator 20. This allows comparators 211, 221 to have high bandwidth and high resolution. For example, in a 6 Gbps PCI Express embodiment in which a valid received signal may be as low as 175 mV and as high as 1.2 V, and a valid idle signal is less than 175 mV and may be as low as 65 mV, comparator 211, 221 may have a bandwidth of at least 4 GHz and may be capable of resolving signal differences of less than 8 mV.

Figure 7:
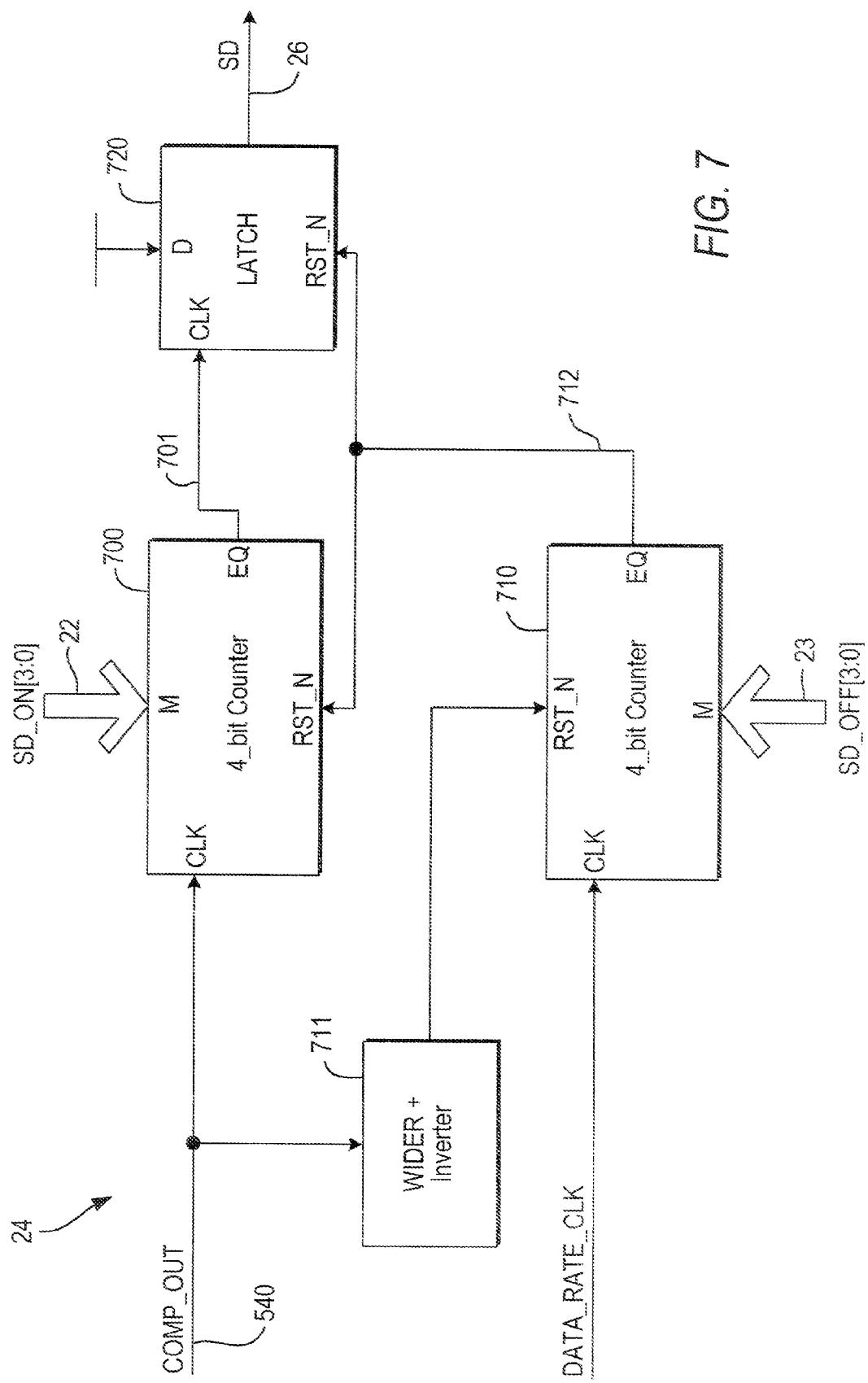
FIG. 7 is a schematic representation of signal detect logic that may be used in signal detect circuitry according to an embodiment of the present invention.

The details of an embodiment of SD_LOGIC 24 are shown in FIG. 7. In this embodiment, SD_LOGIC 24 includes two 4-bit counters 700, 710, each of which is loaded with a respective one of SD_ON[3:0] signal 22 and SD_OFF[3:0] signal 23. SD_ON[3:0] signal 22 allows a user to specify how many data pulses to wait from the receipt of valid data to the turning on of SD, while SD_OFF[3:0] signal 23 allows a user to specify how many clock cycles, at the data rate, to wait after loss of signal to turn SD off.

As seen in FIG. 7, SD_ON counter 700 has as its input comparator output signal 540. If signal 540 remains toggling for the number of pulses indicated by SD_ON[3:0] signal 22, so that SD_ON counter 700 reaches that number without being reset, then SD_ON output 701 will go high, be latched by latch 720 and output as SD signal 26. However, if at any time signal 540 remains low for the number of clock cycles indicated by SD_OFF[3:0] signal 23, so that SD_OFF counter 710 reaches that number without being reset by signal 540 going high (the output of WIDER/inverter 711 going low), output 712 of SD_OFF counter 710 will go high. This will reset counter 700, so that it has to start over before indicating a detected signal, and latch 720 also is reset, so that if a signal had previously been detected, SD signal 26 will go low to indicate loss of signal.

It will be appreciated that the higher the value of SD_ON[3:0] signal 22, the better the noise rejection but the longer it will take to turn on SD 26. Similarly, the higher the value of SD_OFF[3:0] signal 23, the more tolerant the system will be but the longer it will take turn off SD 26 in situations in which it should be turned off. Thus, there is a trade-off in setting these values.

It should be apparent from the foregoing discussion that implementing signal detect circuitry 11 in a programmable integrated circuit device (e.g., a PLD), whether in fixed logic or programmed programmable logic, allows the aforementioned parameters of $V_m$ and the SD_ON/SD_OFF counter values to be programmable or settable by a user.

Although simple, a signal detector according to the present invention exhibits less data pattern dependence than a peak detector. The DC gap of $V_m - V_{cm} = V_{th}$, the signal detect threshold, is proportional to the resistor ratio r/R and does not vary over temperature or process, or even over supply voltage as long as $V_{cm}$ tracks supply. Moreover, two noise filters are included—an RC low-pass filter at the $V_{cm}$ input of the comparator, as well as the SD_ON/SD_OFF counters, which can filter low-frequency noise (i.e., which acts as a high-pass filter).

Figure 8:
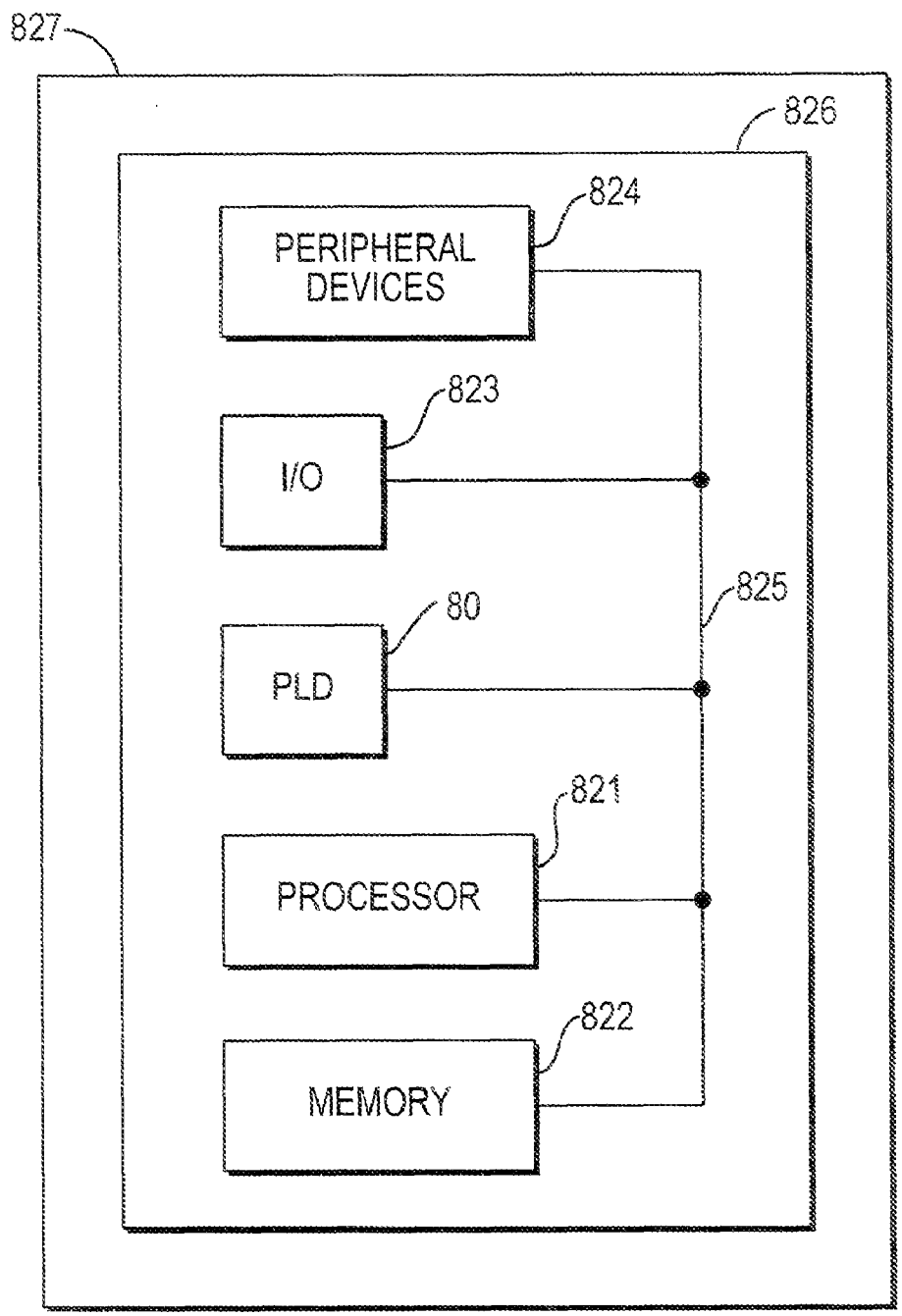
FIG. 8 is a simplified block diagram of an illustrative system employing a programmable logic device incorporating signal detect circuitry in accordance with the present invention.

A PLD 80 incorporating interfaces 10 having signal detect circuitry 11 according to the present invention may be used in many kinds of electronic devices. One possible use is in a data processing system 820 shown in FIG. 8. Data processing system 820 may include one or more of the following components: a processor 821; memory 822; I/O circuitry 823; and peripheral devices 824. These components are coupled together by a system bus 825 and are populated on a circuit board 826 which is contained in an end-user system 827.

System 820 can be used in a wide variety of applications, such as computer networking, data networking, instrumentation, video processing, digital signal processing, or any other application where the advantage of using programmable or reprogrammable logic is desirable. PLD 80 can be used to perform a variety of different logic functions. For example, PLD 80 can be configured as a processor or controller that works in cooperation with processor 821. PLD 80 may also be used as an arbiter for arbitrating access to a shared resources in system 820. In yet another example, PLD 80 can be configured as an interface between processor 821 and one of the other components in system 820. It should be noted that system 820 is only exemplary, and that the true scope and spirit of the invention should be indicated by the following claims. For example, other instances of system 820 may include other types of programmable integrated circuits that incorporate the present invention instead of or in addition to the PLD 80 and/or processor 821.

Various technologies can be used to implement PLDs 80 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. Signal detect circuitry for an input of a serial interface, said signal detect circuitry comprising:
   a reference generator that outputs a reference voltage;
   a comparator that compares said input to said reference voltage to provide a comparator output; and
   signal detection logic comprising a signal detect counter having a programmable signal detect data pulse count threshold, and a loss-of-signal counter having a programmable loss-of-signal clock cycle count threshold, said signal detection logic operating on said comparator output to provide a detection signal indicative of a received signal on said input; wherein:
   said reference voltage and sensitivity of said comparator are programmable.

2. The signal detect circuitry of claim 1 wherein said reference voltage is programmable to determine a threshold for signal detect and loss-of-signal.

3. The signal detect circuitry of claim 2 wherein said reference generator comprises a voltage divider.

4. The signal detect circuitry of claim 3 further comprising:
   a common-mode voltage driver that provides a common-mode voltage and biases said input; wherein:
   said received signal is single-ended; and
   said voltage divider operates on a difference between a supply voltage and said common-mode voltage.

5. The signal detect circuitry of claim 3 wherein:
   said received signal is a differential signal having two differential components; and
   said voltage divider operates on a difference between a supply voltage and a common-mode voltage of said two differential components.

6. The signal detect circuitry of claim 1 wherein:
   said sensitivity is matched to said reference voltage to increase at least one of speed, resolution and bandwidth of said signal detect circuitry.

7. An integrated circuit device comprising:
   programmable circuitry; and
   input/output circuitry in communication with said programmable circuitry, said input/output circuitry including a high-speed serial interface, said high-speed serial interface having signal detect circuitry on an input thereof, said signal detect circuitry comprising:
   a reference generator that outputs a reference voltage;
   a comparator that compares said input to said reference voltage to provide a comparator output; and
   signal detection logic comprising a signal detect counter having a programmable signal detect data pulse count threshold, and a loss-of-signal counter having a programmable loss-of-signal clock cycle count threshold, said signal detection logic operating on said comparator output to provide a detection signal indicative of a received signal on said input; wherein:
   said reference voltage and sensitivity of said comparator are programmable.

8. The integrated circuit device of claim 7 wherein said reference voltage is programmable to determine a threshold for signal detect and loss-of-signal.

9. The integrated circuit device of claim 8 wherein said reference generator comprises a voltage divider.

10. The integrated circuit device of claim 9 wherein:
    said signal detect circuitry further comprises a common-mode voltage driver that provides a common-mode voltage and biases said input;
    said received signal is single-ended; and
    said voltage divider operates on a difference between a supply voltage and said common-mode voltage.

11. The integrated circuit device of claim 9 wherein:
    said received signal is a differential signal having two differential components; and
    said voltage divider operates on a difference between a supply voltage and a common-mode voltage of said two differential components.

12. The integrated circuit device of claim 7 wherein:
    said sensitivity is matched to said reference voltage to increase at least one of speed, resolution and bandwidth of said signal detect circuitry.

13. The integrated circuit device of claim 7 wherein said integrated circuit device is a programmable logic device.

14. A method for detecting a signal on an input of a serial interface, said method comprising:
    generating a programmable reference voltage;
    comparing said input to said reference voltage to provide a comparison output; and
    applying signal detection logic to said comparison output to provide a detection signal indicative of a received signal on said input having a threshold number of counted data pulses without absence of said data pulses for a threshold number of counted clock cycles; wherein:
    said comparing is performed with a comparator having programmable sensitivity; said method further comprising:
    matching said sensitivity to said reference voltage to increase at least one of speed, resolution and bandwidth of said signal detection.

15. Signal detect circuitry for an input of a serial interface, said signal detect circuitry comprising:
    a reference generator that outputs a reference voltage, wherein said reference voltage is programmable to determine a threshold for signal detect and loss-of-signal, and wherein said reference generator comprises a voltage divider, and further comprises a common-mode voltage driver that provides a common-mode voltage and biases said input, and wherein said received signal is single-ended, and said voltage divider operates on a difference between a supply voltage and said common-mode voltage;
    a comparator that compares said input to said reference voltage to provide a comparator output; and signal detection logic that operates on said comparator output to provide a detection signal indicative of a received signal on said input; wherein:

said reference voltage and sensitivity of said comparator are programmable; and said signal detection logic has a programmable signal detect data pulse count threshold and a programmable loss-of-signal clock cycle count threshold.

16. Signal detect circuitry for an input of a serial interface, said signal detect circuitry comprising:

a reference generator that outputs a reference voltage, wherein said reference voltage is programmable to determine a threshold for signal detect and loss-of-signal, and wherein said reference generator comprises a voltage divider, and further biases said input;

a comparator that compares said input to said reference voltage to provide a comparator output wherein said reference voltage and sensitivity of said comparator are programmable; and signal detection logic that operates on said comparator output to provide a detection signal indicative of a received signal on said input; wherein:

said received signal is a differential signal having two differential components;

said voltage divider operates on a difference between a supply voltage and a common-mode voltage of said two differential components; and said signal detection logic has a programmable signal detect data pulse count threshold and a programmable loss-of-signal clock cycle count threshold.

* * * * *